(12) United States Patent
Cloud et al.

(10) Patent No.: US 6,525,413 B1
(45) Date of Patent: Feb. 25, 2003

(54) DIE TO DIE CONNECTION METHOD AND ASSEMBLIES AND PACKAGES INCLUDING DICE SO CONNECTED

(75) Inventors: Eugene H. Cloud, Boise, ID (US); Paul A. Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/615,009

(22) Filed: Jul. 12, 2000

(51) Int. Cl.$^7$ .............................................. H01L 23/02
(52) U.S. Cl. ...................... 257/686; 257/777; 257/724; 257/693
(58) Field of Search ................................ 257/686, 693, 257/707, 724, 777, 783, 666

(56) References Cited

U.S. PATENT DOCUMENTS

| | | |
|---|---|---|
| 5,291,061 A | 3/1994 | Ball |
| 5,302,778 A | 4/1994 | Maurinus |
| 5,435,734 A | 7/1995 | Chow |
| RE35,119 E | 12/1995 | Blonder et al. |
| 5,477,082 A | 12/1995 | Buckley, III et al. |
| 5,477,086 A | 12/1995 | Rostoker et al. |
| 5,532,519 A | 7/1996 | Bertin et al. |
| 5,558,271 A | 9/1996 | Rostoker et al. |
| 5,719,436 A | 2/1998 | Kuhn |
| 5,767,580 A | 6/1998 | Rostoker |
| 5,777,345 A | 7/1998 | Loder et al. |
| 5,790,839 A | 8/1998 | Luk et al. |
| 5,793,101 A | 8/1998 | Kuhn |
| 5,883,814 A | 3/1999 | Luk et al. |
| 5,900,676 A | 5/1999 | Kweon et al. |
| 5,914,535 A | 6/1999 | Brandenburg |
| 5,973,924 A | 10/1999 | Gillespie, Jr. |
| RE36,613 E | 3/2000 | Ball |
| 6,150,724 A * | 11/2000 | Wenzel ........................ 257/777 |
| 6,222,246 B1 * | 4/2001 | Mak ............................. 257/532 |
| 6,232,667 B1 * | 5/2001 | Hultmark ..................... 257/777 |
| 6,310,403 B1 * | 10/2001 | Zhang ......................... 257/786 |
| 6,376,915 B1 | 4/2002 | Hikita et al. |

FOREIGN PATENT DOCUMENTS

| | | | |
|---|---|---|---|
| JP | 404243173 | * | 1/1991 |
| JP | 06151617 A | | 5/1994 |

* cited by examiner

*Primary Examiner*—Olik Chaudhuri
*Assistant Examiner*—Nathan W. Ha
(74) *Attorney, Agent, or Firm*—TraskBritt

(57) ABSTRACT

Assemblies including semiconductor dice flip-chip connected to one another and packages including the assemblies. The assembly includes a first semiconductor die, such as a logic device, with bond pads arranged in an array on an active surface thereof. The assembly also includes at least one second semiconductor die, such as a memory device or an ancillary or parallel logic device, with bond pads on an active surface thereof. The at least one second semiconductor die is oriented with the active surface thereof facing the active surface of the first semiconductor die. The bond pads of the at least one second semiconductor die are connected to corresponding bond pads of the first semiconductor die by way of conductive structures, such as balls, bumps, columns, or pillars of conductive material, disposed therebetween. The package includes the assembly and a carrier, such as a carrier substrate or leads. The first semiconductor die of the assembly is oriented over the carrier with the active surface of the first semiconductor die facing the carrier. Bond pads of the first semiconductor die that are located laterally outside of the location where a periphery of each second semiconductor die is located upon assembly of the dice are electrically connected to corresponding contacts, such as contact pads of the carrier substrate or the leads themselves, by way of conductive structures, such as balls, bumps, columns, or pillars of conductive material. Methods of forming the assemblies and packages are also disclosed.

117 Claims, 7 Drawing Sheets

DIE TO DIE CONNECTION METHOD AND ASSEMBLIES AND PACKAGES INCLUDING DICE SO CONNECTED

BACKGROUND OF THE INVENTION

1. Field of the Invention

The present invention relates generally to multi-chip modules and, particularly, to multi-chip modules including a first semiconductor die with one or more other semiconductor dice connected directly thereto in a flip-chip fashion. The present invention also relates to methods for assembling these multi-chip modules. In addition, the present invention relates to semiconductor device packages including the inventive multi-chip modules and to methods for forming such packages.

2. State of the Art

Accompanying the trend toward manufacturing computers and other electronic devices of ever increasing speed and ever decreasing size is the need for semiconductor device components of ever increasing capabilities and, thus, having an increased number of features that consume the same or a lesser amount of space.

Multi-chip modules are one example of an approach that has been taken in the semiconductor device industry to increase the feature density of semiconductor devices. Known multi-chip modules typically include a plurality of semiconductor dice that may be electrically connected to one another indirectly by way of carrier substrates to which each of the dice are electrically connected.

U.S. Pat. No. 5,914,535 (hereinafter "the '535 Patent"), issued to Brandenburg on Jun. 22, 1999, discloses a multi-chip module including a daughter board with several semiconductor dice flip-chip bonded thereto. The daughter board includes contact pads located outside of a periphery of an area where the semiconductor dice are flip-chip bonded to facilitate flip-chip connection of the multi-chip module to a mother board with the dice of the multi-chip module being located between the daughter board and the mother board.

Another type of multi-chip module is disclosed in U.S. Pat. No. 5,719,436 (hereinafter "the '436 Pat. No. ") and 5,793,101 (hereinafter "the '101 Pat."), issued to Kuhn on Feb. 17, 1998 and Aug. 11, 1998, respectively. Both the '436 and '101 Patents disclose packaged multi-chip modules that include a plurality of semiconductor dice. Each package includes a substrate bearing conductive traces, to which each of the semiconductor dice are electrically connected. The semiconductor dice may be electrically connected to the substrate by way of wire bonding or flip-chip bonding. The substrate, which may comprise a flex circuit, wraps around and is supported by both surfaces of a die paddle. The conductive traces of the substrate are electrically connected to leads by bond wires. Bond pads of the semiconductor dice may also be directly electrically connected to the leads of the package.

U.S. Pat. No. RE36,613, issued to Ball on Mar. 14, 2000, discloses a multi-chip module including stacked semiconductor dice. While the dice are stacked one on top of another, they are not directly connected to one another, but rather to leads of a package including the multi-chip module.

Other types of multi-chip modules that include one or more semiconductor dice that are flip-chip bonded to a carrier are also known. None of these multi-chip modules, however, includes semiconductor dice that are directly flip-chip bonded to one another with the subsequent assembly then being flip-chip mounted to a substrate.

Keeping in mind the trend toward faster computers and other electronic devices, the use of intermediate conductive elements, such as wire bonds, and the conductive traces of carrier substrates to electrically connect the semiconductor dice of a multi-chip module is somewhat undesirable since the electrical paths of these types of connections are typically lengthy and, consequently, limit the speed with which the semiconductor dice of the multi-chip module may communicate with one another. The affects that these types of connections in conventional multi-chip modules have on the speed at which an electronic device, such as a computer, operates are particularly undesirable when one of the semiconductor dice of the multi-chip module is a microprocessor and the other semiconductor dice of the multi-chip module are semiconductor devices with which the microprocessor should quickly communicate.

The so-called system-on-a-chip (SOC) has been developed to increase the speed with which two semiconductor devices, such as a logic device (e.g., a microprocessor) and a memory device, communicate. Each of the semiconductor devices of a SOC structure are fabricated on the same substrate, providing very short connections with reduced contact resistance between two or more devices. The speed with which the two devices communicate is, therefore, increased relative to the speeds with which the separate semiconductor devices of conventional assemblies communicate.

While system-on-a-chip technology provides much quicker communication between different semiconductor devices, the fabrication processes that are used to make different types of semiconductor devices, such as logic and memory devices, differ significantly. In fact, the best processes to fabricate similar structures on different types of semiconductor devices may be very different. Moreover, the organization and locations of structures on different types of semiconductor devices may also differ significantly. Thus, it is not only difficult to merge two or more processes to facilitate the simultaneous fabrication of two or more different types of semiconductor devices on the same substrate, such simultaneous fabrication also requires process compromises for one or more of the types of semiconductor devices being fabricated, which may increase fabrication costs and decrease the performance of one or more of the different types of simultaneously fabricated semiconductor devices.

Accordingly, there is a need for a multi-chip module with increased speed of communication between the semiconductor dice thereof, the semiconductor dice of which may be fabricated by existing processes.

SUMMARY OF THE INVENTION

The present invention includes an assembly of a first semiconductor die and at least one second semiconductor die. Each second semiconductor die of the assembly is flip-chip bonded to the first semiconductor die thereof. The assembly may also include a carrier substrate configured to have the first semiconductor die connected thereto in a flip-chip fashion.

The first semiconductor die includes bond pads arranged in an array over an active surface thereof. While some of the bond pads of the first semiconductor die are arranged on the active surface thereof so as to correspond to a footprint of bond pads of each second semiconductor die, others of the bond pads of the first semiconductor die are positioned so as to be exposed laterally beyond outer peripheries of one or more second semiconductor dice upon assembly thereof with the first semiconductor die. Each of the bond pads of the first semiconductor die that corresponds to a bond pad of a second semiconductor die may be recessed relative to the active surface so as to facilitate alignment and electrical connection with conductive structures protruding from the bond pads of the second semiconductor die. Each of the other, outer bond pads of the first semiconductor die, which may also be recessed relative to the active surface, may have protruding therefrom a conductive structure. Exemplary conductive structures include, but are not limited to, balls, bumps, columns, and pillars of conductive material, such as a solder, another metal or metal alloy, a conductive epoxy, a conductor-filled epoxy, or a z-axis conductive elastomer. These conductive structures facilitate electrical connection of an assembly including the first semiconductor die to a carrier for such an assembly. The first semiconductor die may be a microprocessor die or a die of any other known semiconductor device type.

Each second semiconductor die includes an active surface with a plurality of bond pads thereon. The bond pads of each second semiconductor die may be arranged on the active surface thereof in any manner known in the art, but are preferably disposed across the surface of each second semiconductor die in an array. The bond pads of each second semiconductor die are positioned so as to align with corresponding bond pads of the first semiconductor die upon orienting the second semiconductor die with the active surface thereof facing the active surface of the first semiconductor die. The bond pads of each second semiconductor die may be recessed relative to the active surface thereof so as to at least partially receive and align conductive structures with the bond pads. Each bond pad of each second semiconductor die may have a conductive structure secured thereto and protruding therefrom so as to facilitate electrical communication between first and second semiconductor dice upon assembly and electrical connection thereof. Semiconductor devices that may be used as a second semiconductor die include, without limitation, dynamic random access memories (DRAMs), static random access memories (SRAMs), other types of memory devices, ancillary or logic devices, and other known types of semiconductor devices.

The assembly may also include an alignment structure on the active surface of the first semiconductor die. The alignment structure preferably protrudes from the active surface of the first semiconductor die and includes at least one member configured to guide at least two adjoined peripheral edges of a second semiconductor die so as to facilitate the alignment of bond pads of the second semiconductor die with corresponding bond pads of the first semiconductor die upon orientation of the first and second semiconductor dice with the active surfaces thereof facing each other. The alignment structure thereby facilitates the formation of short, reliable electrical connections between corresponding bond pads of the first and second semiconductor dice. Each member of the alignment structure is preferably formed from an electrically insulative material and may be fabricated by known processes, such as by use of a photoresist, other photoimageable polymers, stereolithographic techniques, or by forming and patterning a layer of material on the active surface of the first semiconductor die. One or more alignment structures may also, or in the alternative, be disposed on a surface of a carrier, such as a carrier substrate, to facilitate the alignment of outer bond pads of the first semiconductor die with contact pads on the surface of the carrier upon orientation of the first semiconductor die with the active surface thereof facing the surface of the carrier.

The contact pads of the carrier are arranged on a surface thereof so as to correspond with a footprint of other, outer bond pads of the first semiconductor die that are to be located laterally beyond an outer periphery of a second semiconductor die upon assembly of the second semiconductor die with the first semiconductor die. Accordingly, the contact pads of the carrier are so located as to facilitate the flip-chip type connection of the first semiconductor die to the carrier. The carrier may also include, formed in the surface thereof, at least one recess configured and located to at least partially receive a corresponding second semiconductor die.

The first semiconductor die and each second semiconductor die to be electrically connected therewith may be assembled by orienting each second semiconductor die with the bond pads thereof in alignment with corresponding bond pads of the first semiconductor die. In such orienting, the active surfaces of the first and second semiconductor dice are facing one another. Bumps or other conductive structures on bond pads of one of the first and second semiconductor dice may be received by recesses of the other of the first and second semiconductor dice to facilitate alignment and electrical connection of the corresponding bond pads of the first and second semiconductor dice. Alternatively, or in addition, the orientation of each second semiconductor die relative to the first semiconductor die may be effected by way of an alignment structure protruding from the active surface of the first semiconductor die. Once each second semiconductor die has been properly oriented relative to the first semiconductor die, corresponding bond pads of the first and second semiconductor dice may be electrically connected by way of forming flip-chip type connections utilizing the conductive structures.

The assembly of semiconductor dice flip-chip bonded to one another may then be assembled with a carrier by orienting the active surface of the first semiconductor die over the surface of the carrier, with the outer bond pads of the first semiconductor die and the corresponding contact pads of the carrier in substantial alignment. Each recess formed in the surface of the carrier may also receive the corresponding second semiconductor die during orientation of the first semiconductor die over the carrier. Again, orientation of the first semiconductor die over the carrier may be facilitated by alignment structures protruding from the surface of the carrier. Once the first semiconductor die has been properly oriented over the carrier, the outer bond pads of the first semiconductor die and the corresponding contact pads of the carrier may be electrically connected to one another by way of known flip-chip type connections.

Alternatively, the first semiconductor die, at least one second semiconductor die, and the carrier substrate may be assembled by disposing each second semiconductor die in a corresponding recess of the carrier substrate and orienting the first semiconductor die over each second semiconductor die and the carrier substrate so as to align the bond pads thereof with corresponding bond pads of each second semiconductor die and with corresponding contact pads of the carrier. Electrical connections between bond pads of the first semiconductor die and the corresponding bond pads of each second semiconductor die may be formed substantially simultaneously with the electrical connections between the outer bond pads of the first semiconductor die and the corresponding contact pads of the carrier.

Once the semiconductor dice and the carrier have been assembled, at least the electrical connections between the first semiconductor die and each second semiconductor die connected thereto, as well as the connections between the first semiconductor die and the carrier, may be protected with an encapsulant material. For example, an underfill material may be introduced between the first semiconductor die and the carrier. As another example, known encapsulation techniques, such as transfer molding or the use of glob-top encapsulant materials, may be used to substantially cover and encapsulate the first and second semiconductor dice.

Other features and advantages of the present invention will become apparent to those of skill in the art through consideration of the ensuing description, the accompanying drawings, and the appended claims.

DETAILED DESCRIPTION OF THE INVENTION

Figure 1:
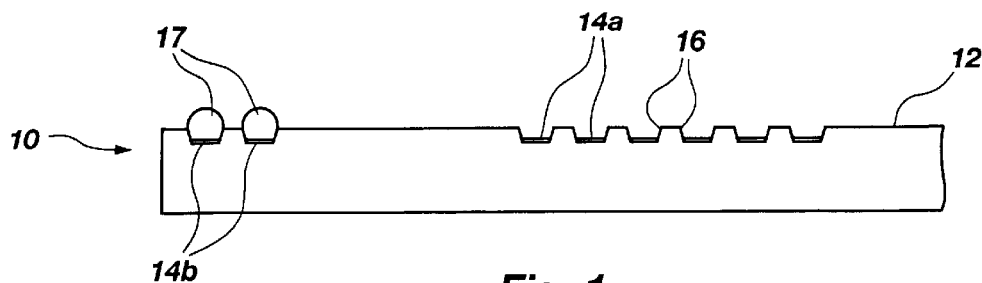
FIG. 1 is a cross-sectional representation of a first semiconductor die that may be used in assemblies and packages incorporating teachings of the present invention.
Figure 4:
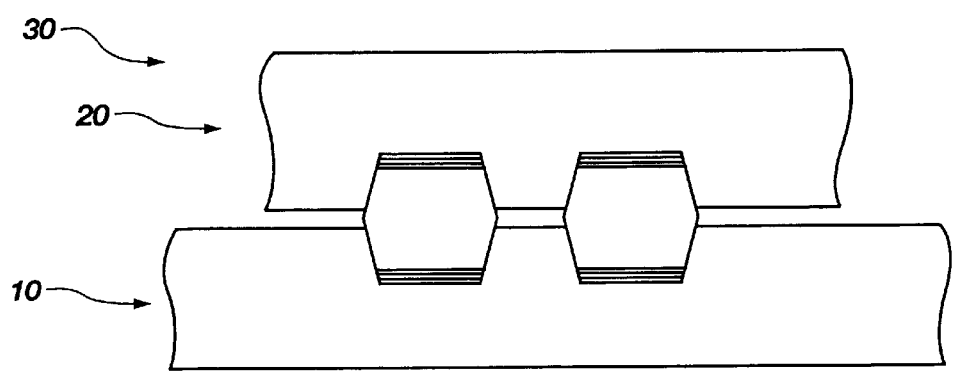
FIG. 4 is a cross-sectional representation of the assembly shown in FIG. 3 with corresponding bond pads of the first and second semiconductor dice being electrically connected to each other.

With reference to FIG. 1, a first semiconductor die 10 that is useful in an assembly 30 (see FIG. 4) incorporating teachings of the present invention is illustrated. First semiconductor die 10 includes an active surface 12 to which bond pads 14a and 14b (collectively referred to herein as bond pads 14) are exposed. As illustrated, bond pads 14 are recessed relative to active surface 12 and are each laterally surrounded by an upwardly extending alignment wall 16. Alignment wall 16 is preferably configured to receive a conductive structure, such as a ball, bump, column, or pillar of conductive material, such as a metal, a metal alloy, a conductive epoxy, a conductor-filled epoxy, or a z-axis conductive elastomer. While alignment walls 16 are depicted as being substantially flat and extending at an angle relative to a plane of first semiconductor die 10, shaped (i.e., curved or stepped) or textured alignment walls, as well as vertically extending alignment walls, are also within the scope of the present invention. Alternatively, bond pads 14 may be substantially flush with or protrude somewhat from active surface 12 of first semiconductor die 10.

Outer bond pads 14b of first semiconductor die 10 may have conductive structures 17 secured thereto and protruding therefrom. Conductive structures 17 facilitate communication between first semiconductor die 10 and a carrier to which first semiconductor die 10 or an assembly including first semiconductor die 10 is electrically connected.

Figure 2:
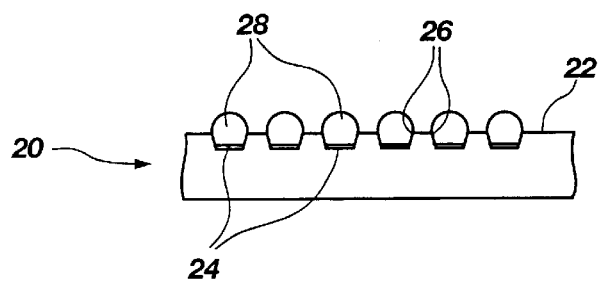
FIG. 2 is a cross-sectional representation of a second semiconductor die useful in assemblies and packages incorporating teachings of the present invention.

Referring now to FIG. 2, a second semiconductor die 20 that may be used in assembly 30 (see FIG. 4) is illustrated. Second semiconductor die 20 includes bond pads 24 arranged on an active surface 22 thereof. Bond pads 24 are positioned upon active surface 22 so as to align with corresponding bond pads 14a of first semiconductor die 10 upon orientation of second semiconductor die 20 over first semiconductor die 10, with active surface 22 facing active surface 12. Bond pads 24 of second semiconductor die 20 may be recessed relative to active surface 22 similarly to bond pads 14 of first semiconductor die 10. Accordingly, bond pads 24 of second semiconductor die 20 may each be laterally surrounded by a generally upwardly extending alignment wall 26, similar to alignment walls 16 of first semiconductor die 10. As shown in FIG. 2, each bond pad 24 of second semiconductor die 20 has a conductive structure 28 secured thereto. The illustrated conductive structures 28 are solder bumps. Other known types of conductive structures 28 are also within the scope of the present invention, including, without limitation, balls, bumps, columns, or pillars of conductive materials such as metals, metal alloys, conductive epoxies, conductor-filled epoxies, or z-axis conductive elastomers. Alternatively, conductive structures 28 may be secured to corresponding bond pads 14a of first semiconductor die 10.

Figure 3:
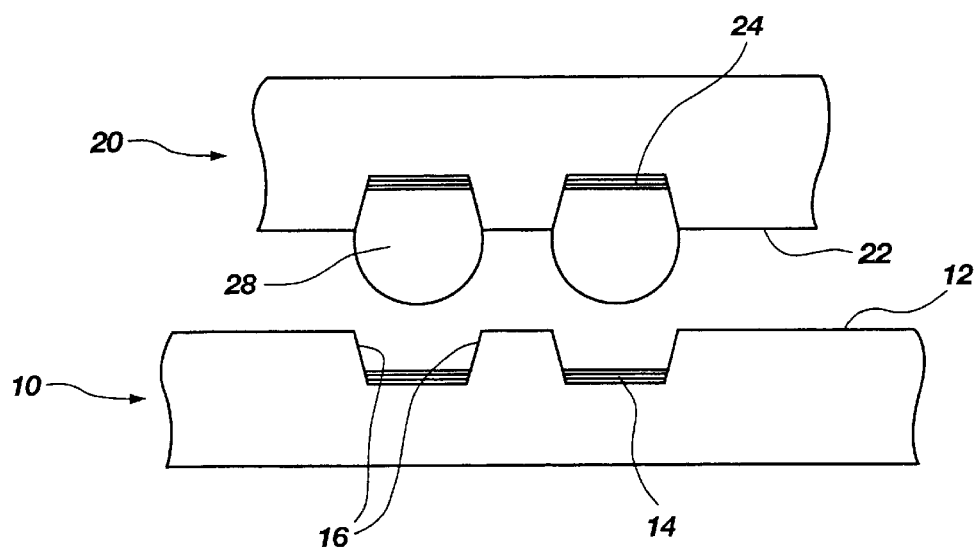
FIG. 3 is a cross-sectional representation of an assembly including the first semiconductor die shown in FIG. 1 and the second semiconductor die shown in FIG. 2 prior to the formation of electrical connections between the corresponding bond pads of the first and second semiconductor dice.

As illustrated in FIG. 3, a second semiconductor die 20 is oriented over first semiconductor die 10 with active surface 22 of second semiconductor die 20 facing active surface 12 of first semiconductor die 10. As bond pads 24 of second semiconductor die 20 are aligned with corresponding bond pads 14 of first semiconductor die 10, these corresponding bond pads 24 and 14 may be electrically connected to one another. Such alignment may be facilitated as alignment walls 16 of first semiconductor die 10 receive conductive structures 28 protruding from second semiconductor die 20. Conductive structures 28 may be electrically connected to corresponding bond pads 14 of first semiconductor die 10 as known in the art, such as by reflowing the conductive material thereof, to provide an electrically connected assembly 30 of first semiconductor die 10 and at least one second semiconductor die 20, such as that depicted in FIG. 4.

As corresponding bond pads 14 and 24 are electrically connected to one another by way of conductive structures 28, the physical lengths of electrical circuits including conductive structures 28 are much shorter than the physical lengths of circuits including wire bonds or conductive traces of carrier substrates, as have been employed in conventional multi-chip modules. Accordingly, first semiconductor die 10 may communicate with connected semiconductor dice, such as second semiconductor die 20, at much faster rates than are possible with conventional multi-chip modules.

Figure 5:
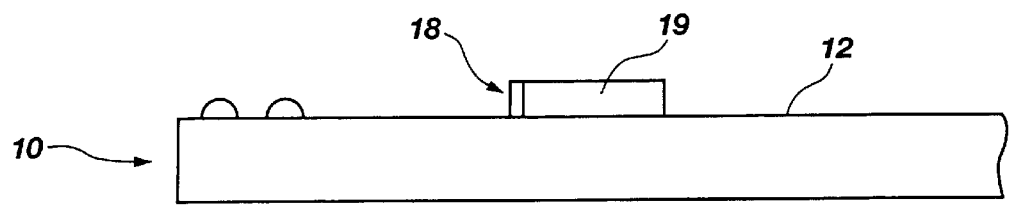
FIG. 5 is a side view of a first semiconductor die, such as that shown in FIG. 1, with an alignment structure protruding from an active surface thereof.

As shown in FIG. 5, first semiconductor die 10 may have an alignment structure 18 secured to active surface 12 thereof. Alignment structure 18 is preferably configured to guide at least two adjoined peripheral edges of another semiconductor die during orientation thereof upon active surface 12 of first semiconductor die 10.

Figure 6:
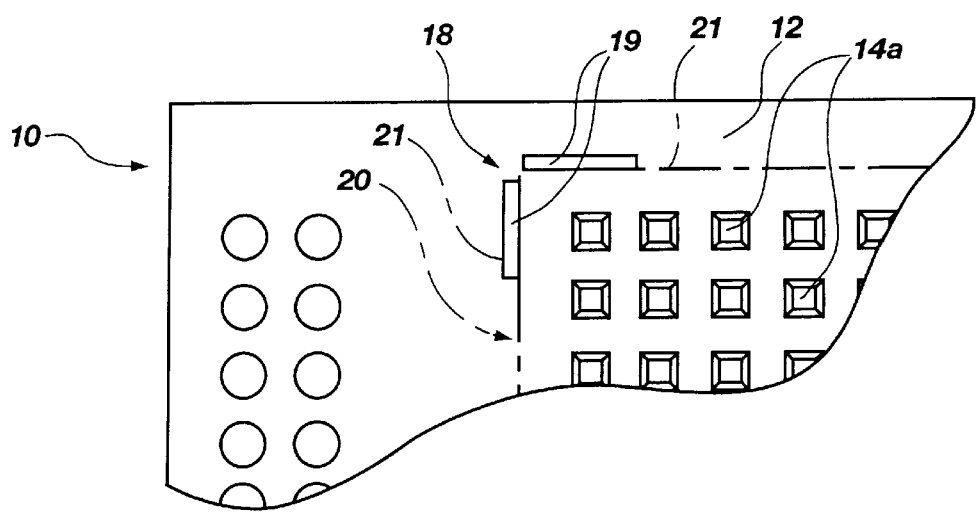
FIG. 6 is a top view of the first semiconductor die and a variation of an alignment structure on an active surface of the first semiconductor die, showing use of the alignment structure to align a second semiconductor die, depicted in phantom, with the first semiconductor die.

FIG. 6 illustrates the use of alignment structure 18 to properly align bond pads 24 of a second semiconductor die 20 (FIG. 2) relative to corresponding bond pads 14a of first semiconductor die 10 upon orientation of second semiconductor die 20 over first semiconductor die 10 with active surface 22 facing active surface 12. As shown in FIG. 6, alignment structure 18 includes two members 19. Alignment structures 18, however, with other numbers or configurations of members 19 that are configured to guide two or more adjoining peripheral edges 21 of second semiconductor die 20 are also within the scope of the present invention.

Each member 19 of alignment structure 18 may be fabricated by known processes. For example, members 19 of alignment structure 18 may be fabricated directly upon active surface 12 of first semiconductor die 10 by forming a material layer, such as a layer of glass, silicon dioxide, or silicon nitride by known processes, on active surface 12 and patterning the material layer, also by known processes. As another example, a photoimageable material, such as a photoresist or a polyimide, may be disposed on active surface 12 of first semiconductor die 10 and patterned by known photoimaging processes. In another example of the fabrication of alignment structure 18, members 19 thereof may be formed by known stereolithography techniques, such as that disclosed in U.S. patent application Ser. No. 09/259,142, filed on Feb. 26, 1999, and assigned to the assignee of the invention disclosed and claimed herein, the disclosure of which is hereby incorporated by this reference in its entirety. When stereolithography is employed to fabricate members 19 of alignment structure 18, one or more layers of substantially unconsolidated material, such as a photoimageable polymer, or "photopolymer," may be formed and at least partially selectively consolidated. If member 19 includes a plurality of layers, the layers are at least partially superimposed over one another, contiguous with one another, and mutually adhered to each other. Of course, stereolithography may be used to fabricate alignment structures 18 directly on active surface 12 or separately from first semiconductor die 10, in which case each member 19 of alignment structure 18 may subsequently be secured to active surface 12 as known in the art, such as by use of an appropriate adhesive material.

FIGS. 7–10 illustrate exemplary packages that include an assembly 30 of a first semiconductor die 10 and a second semiconductor die 20.

Figure 7:
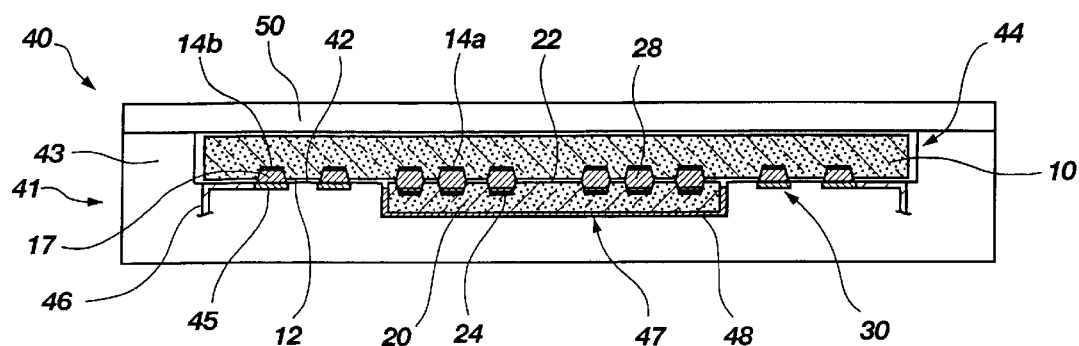
FIG. 7 is a cross-sectional representation of a package including the assembly shown in FIG. 4, a package body to which the assembly is electrically connected, and a package lid.

As illustrated in FIG. 7, one embodiment of a package 40 includes assembly 30, a package body 41, which is also referred to herein as a carrier substrate, configured to receive assembly 30 and to be electrically connected thereto, and a package lid 50 configured to be assembled with package body 41 so as to enclose assembly 30 within package 40. As illustrated, package body 41 includes a recessed surface 42 laterally bounded by upwardly extending peripheral walls 43. Peripheral walls 43 define a receptacle 44 configured to receive assembly 30. Surface 42 carries contact pads 45 that are arranged thereon so as to align with corresponding outer bond pads 14b of first semiconductor die 10 upon introduction of assembly 30 into receptacle 44 with active surface 12 of first semiconductor die 10 facing surface 42 of package body 41. Contact pads 45 are electrically connected to conductive traces 46 that are carried by package body 41 and, in turn, electrically connected to terminals or other connective elements (not shown) that facilitate communication between semiconductor dice 10, 20 of package 40 and external components (not shown). As an alternative to the embodiment of first semiconductor die 10 depicted in FIG. 1, conductive structures 17 may be secured to corresponding contact pads 45 of package body 41, rather than to outer bond pads 14b of first semiconductor die 10.

As shown, package body 41 also includes a die receptacle 47 recessed in surface 42. Die receptacle 47 is located and configured to at least partially receive a second semiconductor die 20 of assembly 30. Each die receptacle 47 may include therein a quantity of thermal grease 48 of a known type to facilitate the transfer of heat away from second semiconductor die 20 during operation thereof. Thermal grease 48 may also be used to secure second semiconductor die 20 or assembly 30 to a carrier, such as package body 41, prior to the bonding of outer bond pads 14b to their corresponding contact pads 45 with conductive structures 17.

If the depth of die receptacle 47 is substantially equal to the thickness of second semiconductor die 20 (not including the distance conductive structures 28 protrude from active surface 22 thereof), conductive structures 28 may protrude from active surface 22 of second semiconductor die 20 substantially the same distance that conductive structures 17 protrude from active surface 12 of first semiconductor die 10. Of course, the distance that conductive structures 17 protrude from active surface 12 of first semiconductor die 10 is preferably sufficient to permit conductive structures 17 to contact corresponding contact pads 45 upon orientation of first semiconductor die 10 invertedly over package body 41 or another carrier.

Following orientation of assembly 30 within receptacle 44 and relative to package body 41, assembly 30 may be electrically connected to package body 41 by reflowing conductive structures 17 protruding from outer bond pads 14b to secure conductive structures to contact pads 45 corresponding to outer bond pads 14b, or as otherwise known in the art.

Once assembly 30 has been disposed within receptacle 44 and electrically connected to package body 41, lid 50 may be disposed over receptacle 44 so as to enclose assembly 30 within package 40. Lid 50 may be secured to package body 41 as known in the art, such as by use of adhesives or mechanically.

An alternative method for electrically connecting assembly 30 to package body 41 includes orienting a second semiconductor die 20 in each die receptacle 47 of package body 41 with active surface 22 facing into receptacle 44. A first semiconductor die 10 is invertedly oriented within receptacle 44 with active surface 12 thereof facing surface 42 of package body 41 and active surface 22 of second semiconductor die 20. During such orientation, bond pads 24 and corresponding bond pads 14a, as well as outer bond pads 14b and corresponding contact pads of package body 41 are aligned. Conductive structures 17 and 28 may then be connected between bond pads 24 and corresponding bond pads 14a and between outer bond pads 14b and corresponding contact pads 45 as known in the art, such as by reflowing the conductive materials of conductive structures 17 and 28. In this manner, electrical connections between first and second semiconductor dice 10 and 20, as well as between assembly 30 and package body 41, may be substantially simultaneously formed.

Figure 8:
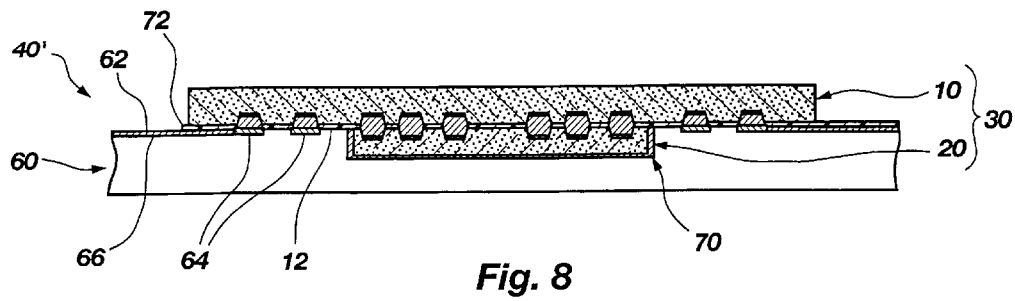
FIG. 8 is a cross-sectional representation of another embodiment of a package incorporating teachings of the present invention and including the assembly depicted in FIG. 4, a carrier substrate to which the assembly is electrically connected, and an underfill material between at least a portion of the first semiconductor die and the adjacent portion of the carrier substrate.

Referring now to FIG. 8, another embodiment of a package 40' incorporating teachings of the present invention is illustrated. Package 40' includes a substantially planar carrier substrate 60. Carrier substrate 60 includes a surface 62 upon which contact pads 64 are carried. Conductive traces 66 that communicate with corresponding contact pads 64 are also carried by carrier substrate 60 and lead to external conductive elements (not shown) to facilitate communication between an assembly 30 electrically connected to carrier substrate 60 and external components (not shown). Carrier substrate 60 may also include at least one receptacle 70 recessed in surface 62. Each receptacle 70 is preferably located and configured so as to at least partially receive a second semiconductor die 20 of an assembly 30 upon orientation of assembly 30 over carrier substrate 60 with active surface 12 of first semiconductor die 10 facing surface 62 of carrier substrate 60. Assembly 30 may be electrically connected and secured to carrier substrate 60 by known processes, such as those disclosed with reference to the connection of assembly 30 to package body 41 illustrated in FIG. 7. Package 40' also includes a quantity of underfill material 72 of a known type between active surface 12 of first semiconductor die 10 and surface 62 of carrier substrate 60.

Figure 9:
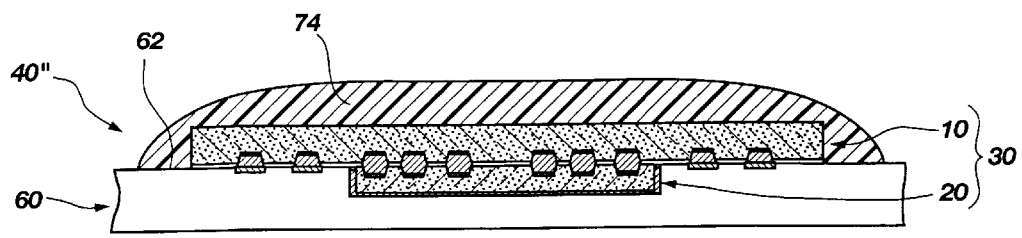
FIG. 9 is a cross-sectional representation of another embodiment of a package according to the present invention, including the assembly depicted in FIG. 4, a carrier substrate to which the assembly is electrically connected, and a glob-top type encapsulant disposed over the first semiconductor die.

FIG. 9 illustrates another embodiment of package 40", which includes a substantially planar carrier substrate 60 with an assembly 30 of a first semiconductor die 10 and second semiconductor die 20 electrically connected and secured thereto. Package 40" also includes a quantity of encapsulant material 74 disposed over first semiconductor die 10 and in contact with surface 62 of carrier substrate 60 so as to encapsulate and seal assembly 30. As illustrated, encapsulant material 74 is a conventional "glob-top" type encapsulant, such as silicone or an epoxy.

Figure 10:
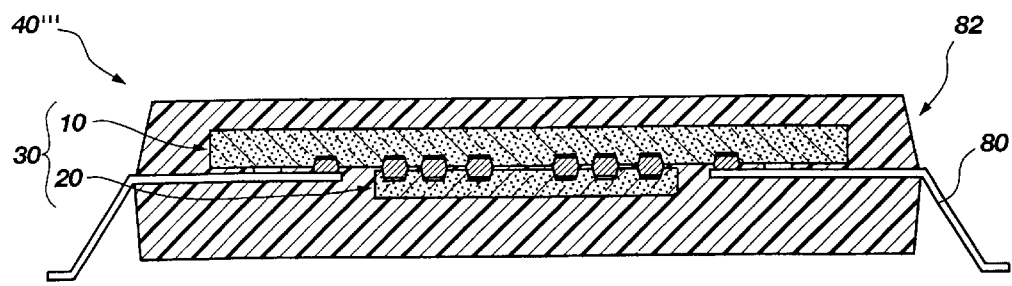
FIG. 10 is a cross-sectional representation of another embodiment of a package of the present invention, which includes the assembly depicted in FIG. 4, leads to which the assembly is electrically connected, and a molded package covering the assembly.

Yet another embodiment of a package 40''' according to the present invention is illustrated in FIG. 10. Package 40''' includes assembly 30 electrically connected to a carrier comprising leads 80, such as in the illustrated leads-over-chip (LOC) arrangement. Package 40''' includes a molded encapsulant 82 substantially covering and encapsulating assembly 30. Molded encapsulant 82 may be fabricated from known materials, such as thermoset resins (including particle-filled resins), and by known techniques, such as transfer molding processes. Thus, conductive structures 17, 28 are preferably formed from a conductive material that will survive the transfer molding process, such as a conductive epoxy or a conductor-filled epoxy.

Figure 11:
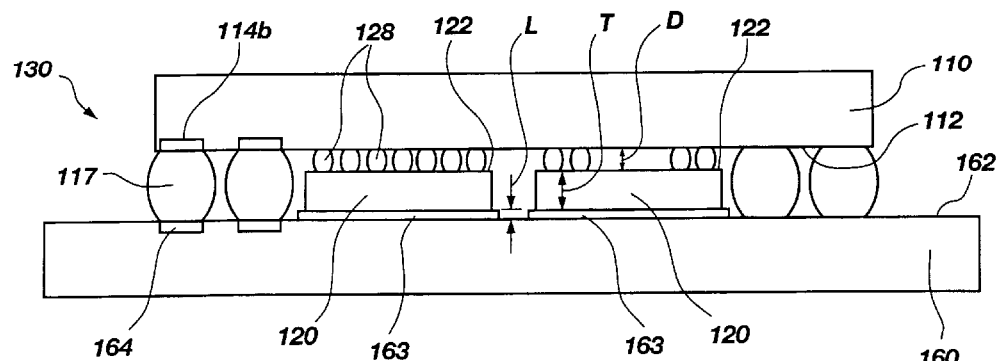
FIG. 11 is a cross-sectional representation of an assembly including a first semiconductor die with two second semiconductor dice flip-chip connected thereto, the first semiconductor die being flip-chip connected to a carrier substrate with conductive structures that each include a single member.
Figure 12:
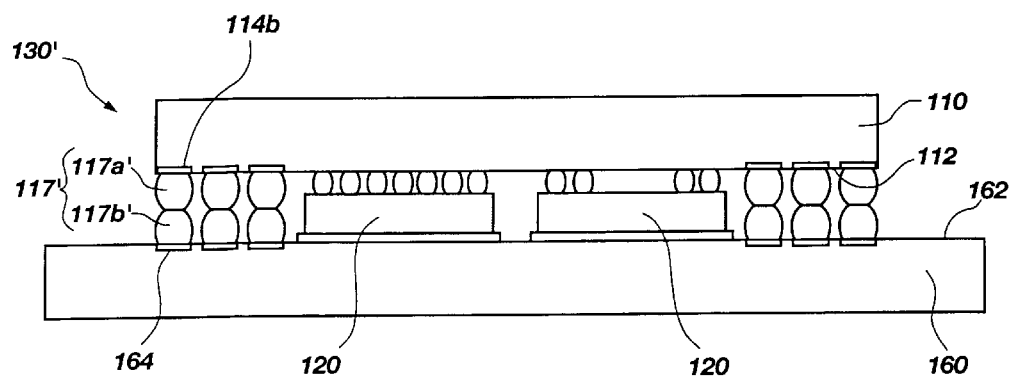
FIG. 12 is a cross-sectional representation of an assembly including a first semiconductor die with two second semiconductor dice flip-chip connected thereto, the first semiconductor die being flip-chip connected to a carrier substrate with conductive structures that each include two members.
Figure 13:
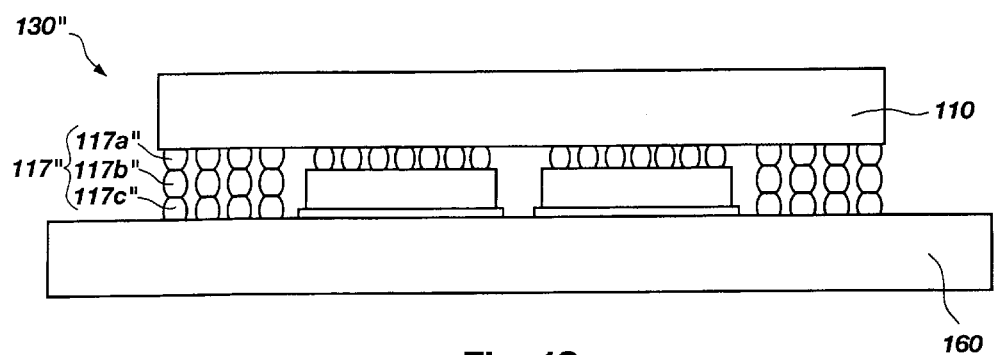
FIG. 13 is a cross-sectional representation of an assembly including a first semiconductor die with two second semiconductor dice flip-chip connected thereto, the first semiconductor die being flip-chip connected to a carrier substrate with conductive structures that each include three members.

FIGS. 11–13 depict alternative types of conductive structures that may be used in accordance with teachings of the present invention.

FIG. 11 illustrates an assembly 130 that includes one first semiconductor die 110 and two second semiconductor dice 120 flip-chip connected thereto by way of conductive structures 128, such as solder balls. Assembly 130 also includes a carrier substrate 160 upon which second semiconductor dice 120 rest and to which first semiconductor die 110 is electrically connected.

As illustrated, each second semiconductor die 120 rests upon a layer of thermal grease 163 of thickness L disposed on a surface 162 of carrier substrate 160. Each second semiconductor die 120 has a thickness T. Each conductive structure 128 extends a distance D between a plane of active surface 122 of second semiconductor die 120 and a plane of active surface 112 of first semiconductor die 110. Thus, active surface 112 of first semiconductor die 110 is separated from surface 162 of carrier substrate 160 by a distance of about L+T+D. Accordingly, in order to connect outer bond pads 114b of first semiconductor die 110 and corresponding contact pads 164 of carrier substrate 160, conductive structures 117 extending between corresponding outer bond pads 114b and contact pads 164 preferably have a height of about L+T+D.

A variation of an assembly 130' incorporating teachings of the present invention, shown in FIG. 12, includes the same elements as assembly 130, shown in FIG. 11, except for conductive structures 117. Rather, assembly 130' includes conductive structures 117' that include two members 117a' and 117b'. Members 117a' may be predisposed on outer bond pads 114b of first semiconductor die 110, while members 117b' may be predisposed on contact pads 164 of carrier substrate 160. The collective distances that members 117a' and 117b' protrude from active surface 112 and surface 162, respectively, are about equal to L+T+D. As first semiconductor die 110 is invertedly oriented and aligned over carrier substrate 160, members 117a' and 117b' of each conductive structure 117' are aligned and abut one another. Upon reflowing the conductive material of members 117a' and 117b' or otherwise securing corresponding members 117a' and 117b' to one another, integral conductive structures 117' that electrically connect corresponding outer bond pads 114b and contact pads 164 to each other are formed.

FIG. 13 depicts another variation of an assembly 130" according to the present invention, which again includes the same elements as assembly 130, shown in FIG. 11, with the exception of conductive structures 117. In place of conductive structures 117 (FIG. 11), assembly 130" includes conductive structures 117" with more than two members, 117a", 117b", 117c", etc.

Members 117a" and 117c" may comprise conductive structures that are predisposed on outer bond pads 114b and their corresponding contact pads 164, respectively. Members 117b" may be formed by the process illustrated in FIGS. 14–17, or as otherwise known in the art.

Figure 14:
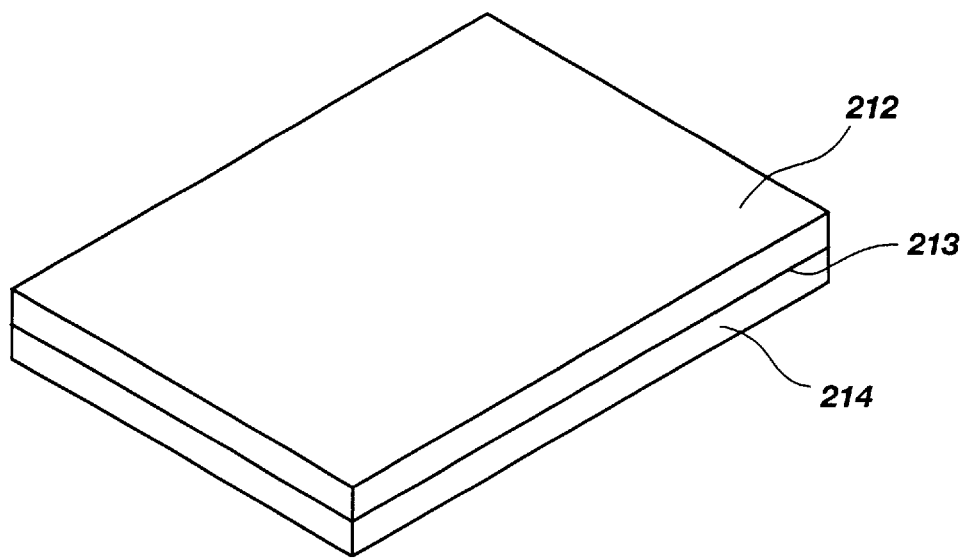
FIGS. 14–16 illustrate an exemplary method for fabricating a conductive mating structure to facilitate fabrication of the assembly shown in FIG. 13.

With reference to FIG. 14, a layer 214 of an electrically insulative support material, such as a polymer (e.g., a polyimide), is applied to a surface 213 of a substantially planar conductive layer 212 including a conductive material that will adhere to the conductive materials of members 117a" and 117c" (FIG. 13) during reflow of the conductive materials or otherwise, as known in the art. Polymeric layer 214 may be applied to conductive layer 212 by known processes, such as by spray-on techniques, spin-on techniques, or by other techniques for forming layers from polymeric materials. Conductive layer 212 may include a single layer of conductive material or more than one sublayer of conductive material.

Figure 15:
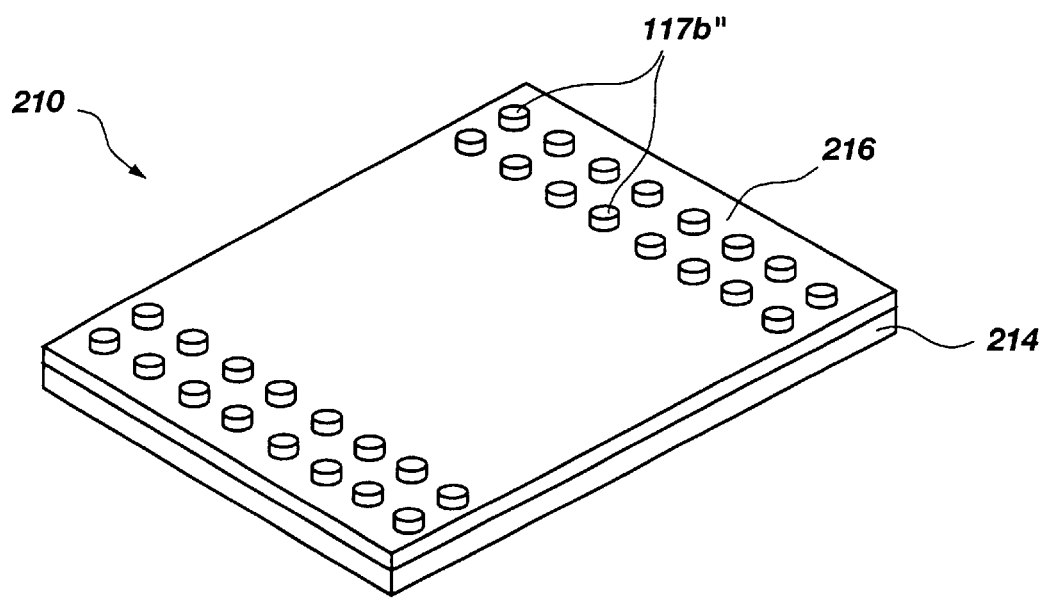

As shown in FIG. 15, conductive layer 212 is patterned to form members 117b' in desired locations on polymeric layer 214. Members 117b" are each preferably sized and positioned so as to facilitate alignment thereof with corresponding members 117a" and 117c" (FIG. 13). Conductive layer 212 may be patterned as known in the art, such as by use of photomask and etch processes. A layer 216 of an electrically insulative support material, such as a polymer (e.g., polyimide or polyester, such as the polyester film marketed by E. I. du Pont De Nemours and Company of Wilmington, Delaware as MYLAR®) or other material that may be removed without damaging conductive structures 117" (FIG. 13) or any of the other components of assembly 130, may then be disposed laterally adjacent at least a portion of each member 117b" so as to support same upon removal of polymeric layer 214 therefrom. Members 117b" and layers 214 and 216 collectively form a conductive mating structure 210.

The structure 210 shown in FIG. 15 may also be fabricated by disposing preformed members 117b" on a layer 214 of an electrically nonconductive polymeric material, with members 117b" being secured to polymeric layer 214 by adhesion of the material thereof or with a separate adhesive material. Layer 216 may then be formed as described above.

Figure 16:
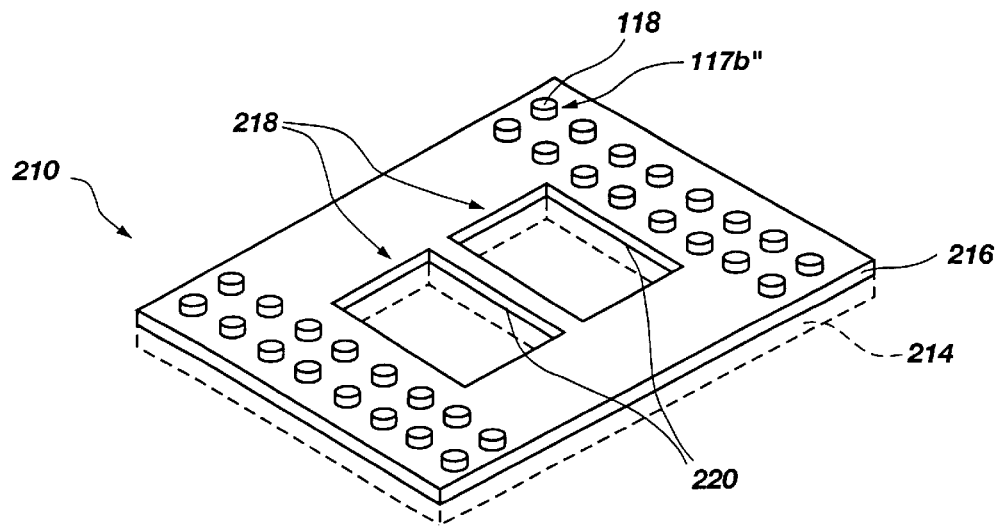

Turning now to FIG. 16, in preparation for electrically connecting first semiconductor die 110 to carrier substrate 160 (FIG. 13), polymeric layer 214 is at least partially removed so as to at least partially expose ends 118 of members 117b". Ends 218 of layers 214 and 216 that are alignable with second semiconductor dice 120 upon assembly are also removed so as to form through structure 210 slots 220 configured to receive second semiconductor dice 120 (FIG. 17).

Figure 17:
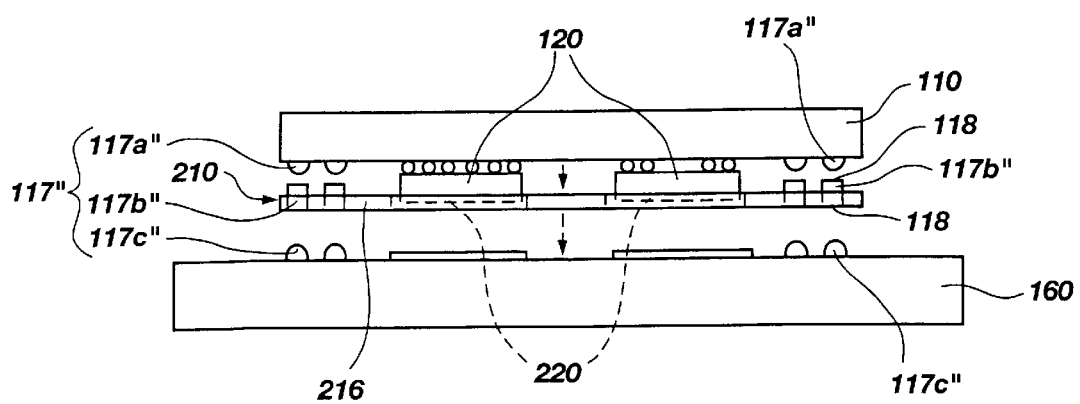
FIG. 17 is a cross-sectional representation of the use of the conductive mating structure depicted in FIG. 16 to form the assembly depicted in FIG. 13.

As illustrated in FIG. 17, carrier substrate 160 and the assembly of first and second semiconductor dice 110, 120 are assembled with structure 210 disposed therebetween. Upon such assembly, corresponding members 117a", 117b", and 117c" of each conductive structure 117" are in substantial alignment and second semiconductor dice 120 are received by corresponding slots 220. Corresponding members 117a", 117b", and 117c" may be secured so as to electrically communicate with one another by known processes, such as by reflowing the conductive material or materials thereof. The remainders of layers 214 (FIG. 16) and 216 may then be removed from assembly 130" or remain therein.

As the lengths of conductive structures 17 and 28 (see, e.g., FIGS. 4 and 7) and, thus, the distances between corresponding bond pads 14a and 24 and between outer bond pads 14b and their corresponding contact pads 45 are relatively short, the speed with which signals may be conveyed between these corresponding pairs of bond pads and contact pads is also increased. This proximity relative to lengthy connections between bond pads or between bond pads and contact pads in conventional multi-chip modules may beneficially facilitate the conveyance of signals of limited signal swing, with reduced signal rise and fall times, between connected semiconductor devices, further increasing the operation of an assembly 30 including multiple dice 10, 20. Accordingly, the number of repeaters in many of the circuits of semiconductor dice 10 and 20 may be reduced so as to limit the signal swing of these circuits.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. An assembly of semiconductor dice comprising:
a first semiconductor die including a plurality of bond pads arranged in an array over an active surface thereof and at least one alignment element secured to and protruding from said active surface for aligning at least one second semiconductor die relative to said active surface, said at least one alignment element comprising a plurality of superimposed, contiguous, mutually adhered layers comprising photopolymer;
said at least one second semiconductor die, including a plurality of bond pads on an active surface thereof, each of said plurality of bond pads of said second semiconductor die alignable with corresponding bond pads of said first semiconductor die in an assembled relationship of said first and second semiconductor dice, said second semiconductor die having a smaller surface area than said first semiconductor die, said active surfaces of said first and second semiconductor dice in said assembled relationship facing one another.

2. The assembly of claim 1, wherein said first semiconductor die comprises a microprocessor.

3. The assembly of claim 1, wherein said second semiconductor die comprises a memory device.

4. The assembly of claim 1, wherein said plurality of bond pads of said second semiconductor die are arranged in an array on said active surface.

5. The assembly of claim 1, wherein said first semiconductor die includes outer bond pads that are exposed laterally beyond an outer periphery of said second semiconductor die.

6. The assembly of claim 5, wherein said outer bond pads are configured to electrically connect at least one of said first and second semiconductor dice to another semiconductor device component.

7. The assembly of claim 1, further comprising conductive structures disposable between corresponding bond pads of said first and second semiconductor dice in said assembled relationship thereof.

8. The assembly of claim 7, wherein said conductive structures comprise balls, bumps, pillars, or columns.

9. The assembly of claim 7, wherein said conductive structures are formed of a material comprising a metal, an alloy, a conductive epoxy, a conductor-filled epoxy, or a z-axis conductive elastomer.

10. The assembly of claim 1, wherein said at least one alignment is configured to guide at least two adjoined edges of said second semiconductor die.

11. The assembly of claim 1, wherein said at least one alignment element comprises recesses in which at least some of said plurality of bond pads of said first semiconductor die are located and recessed relative to said active surface of said first semiconductor die.

12. The assembly of claim 11, wherein said second semiconductor die comprises conductive structures protruding from each of said plurality of bond pads thereof.

13. The assembly of claim 1, wherein at least some of said plurality of bond pads of said second semiconductor die are recessed relative to said active surface thereof.

14. The assembly of claim 1, comprising a plurality of second semiconductor dice.

15. The semiconductor device package of claim 1, wherein said at least one alignment element comprises at least one alignment structure secured to and protruding from said active surface of said first semiconductor die and configured to guide at least two adjoined edges of said second semiconductor die.

16. The semiconductor device package of claim 15, wherein said alignment structure comprises a plurality of superimposed, contiguous, mutually adhered material layers.

17. The semiconductor device package of claim 16, wherein each of said plurality of layers comprises a photopolymer.

18. A semiconductor device package, comprising:
a first semiconductor die including a plurality of bond pads arranged in an array on an active surface thereof and at least one alignment element for aligning at least one second semiconductor die relative to said active surface;
said at least one second semiconductor die, comprising a plurality of bond pads on an active surface thereof, each of said plurality of bond pads of said second semiconductor die alignable with corresponding bond pads of said first semiconductor die, said active surfaces of said first and second semiconductor dice facing one another, and said bond pads of said second semiconductor die electrically connected to said corresponding bond pads of said first semiconductor die, other bond pads of said first semiconductor die being exposed laterally beyond an outer periphery of said second semiconductor die;
an encapsulant substantially covering peripheral edges and a back side of said first semiconductor die; and
a carrier including contacts electrically connected to said other bond pads.

19. The semiconductor device package of claim 18, wherein said carrier comprises a carrier substrate with said contacts comprising contact pads formed on a surface of said carrier substrate.

20. The semiconductor device package of claim 19, wherein said carrier substrate includes a recess formed in said surface and configured to receive said second semiconductor die.

21. The semiconductor device package of claim 19, further comprising a thermally conductive material disposed between a backside of said second semiconductor die and said carrier substrate.

22. The semiconductor device package of claim 18, wherein said carrier comprises leads.

23. The semiconductor device package of claim 18, wherein said first semiconductor die comprises a microprocessor.

24. The semiconductor device package of claim 23, wherein said second semiconductor die comprises a memory device.

25. The semiconductor device package of claim 18, wherein said second semiconductor die comprises a memory device.

26. The semiconductor device package of claim 25, wherein said first semiconductor die comprises a microprocessor.

27. The semiconductor device package of claim 18, wherein said plurality of bond pads of said second semiconductor die are arranged in an array on said active surface.

28. The semiconductor device package of claim 18, wherein said first semiconductor die includes outer bond pads that are exposed laterally beyond an outer periphery of said second semiconductor die.

29. The semiconductor device package of claim 28, wherein said outer bond pads are configured to electrically connect at least one of said first and second semiconductor dice to said carrier.

30. The semiconductor device package of claim 18, wherein said plurality of bond pads of said second semiconductor die and said corresponding bond pads of said first semiconductor die are electrically connected to one another by way of conductive structures disposed therebetween.

31. The semiconductor device package of claim 30, wherein said conductive structures comprise balls, bumps, pillars, or columns.

32. The semiconductor device package of claim 30, wherein said conductive structures are formed of a material comprising a metal, an alloy, a conductive epoxy, a conductor-filled epoxy, or a z-axis conductive elastomer.

33. The semiconductor device package of claim 18, wherein said contacts of said carrier and said other bond pads of said first semiconductor die are electrically connected by conductive structures.

34. The semiconductor device package of claim 33, wherein said conductive structures comprise balls, bumps, pillars, or columns.

35. The semiconductor device package of claim 33, wherein said conductive structures are formed from a material comprising a metal, an alloy, a conductive epoxy, a conductor-filled epoxy, or a z-axis conductive elastomer.

36. The semiconductor device package of claim 33, wherein said conductive structures each comprise a plurality of members.

37. The semiconductor device package of claim 18, further comprising an encapsulant material at least laterally sealing at least said active surfaces of said first and second semiconductor dice.

38. The semiconductor device package of claim 37, wherein said encapsulant material substantially covers at least said first semiconductor die.

39. The semiconductor device package of claim 37, wherein said encapsulant material comprises an underfill material.

40. The semiconductor device package of claim 18, wherein said encapsulant comprises a glob-top encapsulant.

41. The semiconductor device package of claim 22, further comprising a molded package encapsulating said first and second semiconductor dice.

42. The semiconductor device package of claim 18, wherein said at least one alignment element comprises recesses in said active surface of said first semiconductor die within which at least some of said plurality of bond pads of said first semiconductor die are located and recessed relative to said active surface of said first semiconductor die.

43. The semiconductor device package of claim 42, wherein said second semiconductor die comprises conductive structures predisposed on each of said plurality of bond pads thereof.

44. The semiconductor device package of claim 18, wherein at least some of said plurality of bond pads of said second semiconductor die are recessed relative to said active surface thereof.

45. The semiconductor device package of claim 18, comprising a plurality of second semiconductor dice.

46. A computer comprising:
a logic die including an active surface and a plurality of bond pads arranged in an array over said active surface and at least one alignment element for aligning another semiconductor die relative to a prespecified area of said active surface; and
another semiconductor die including an active surface and a plurality of bond pads on said active surface, each of said bond pads of said another semiconductor die being alignable with corresponding bond pads of said logic die in an assembled relationship of said logic die and said another semiconductor die, said active surfaces of said logic die and said another semiconductor die facing one another in said assembled relationship.

47. The computer of claim 46, wherein said another semiconductor die comprises a memory device.

48. The computer of claim 46, further comprising conductive elements electrically connecting said plurality of bond pads of said another semiconductor die and said corresponding bond pads of said logic die in said assembled relationship thereof.

49. The computer of claim 48, wherein said conductive elements comprise balls, bumps, pillars, or columns.

50. The computer of claim 46, wherein said conductive elements comprise a metal, an alloy, a conductive epoxy, a conductor-filled epoxy, or a z-axis conductive elastomer.

51. The computer of claim 46, further comprising a carrier configured to be electrically connected to at least one of said logic die and said another semiconductor die.

52. The computer of claim 51, wherein said carrier includes contacts alignable with outer bond pads of said logic die that are exposed laterally beyond an outer periphery of said another semiconductor die in said assembled relationship of said logic die and said another semiconductor die and upon orientation of said logic die active surface-down relative to said carrier.

53. The computer of claim 52, wherein said carrier comprises a plurality of leads secured to corresponding outer bond pads of said logic die.

54. The computer of claim 52, wherein said carrier comprises a carrier substrate with said contacts comprising contact pads on a surface thereof.

55. The computer of claim 54, wherein said carrier substrate includes a recess formed in said surface and configured to at least partially receive said another semiconductor die in said assembled relationship of said logic die and said another semiconductor die and upon orientation of said logic die said active surface-down over said carrier substrate.

56. A semiconductor device package, comprising: at least a first multi-chip module, including:
a first semiconductor die with a plurality of bond pads arranged in an array on an active surface thereof and at least one alignment element on said active surface, said at least one alignment element configured to position at least one second semiconductor die relative to a prespecified area of said active surface; and
said at least one second semiconductor die with a plurality of bond pads on an active surface thereof, each of said plurality of bond pads of said at least one second semiconductor die alignable with corresponding bond pads of said first semiconductor die, said active surfaces of said first semiconductor die and said at least one second semiconductor die facing one another, and said plurality of bond pads of said at least one second semiconductor die electrically connected to said corresponding bond pads of said first semiconductor die, other bond pads of said first semiconductor die being exposed laterally beyond an outer periphery of said at least one second semiconductor die; and
an encapsulant substantially covering peripheral edges and a back side of said first semiconductor die; and
a carrier including contacts electrically connected to said other bond pads.

57. The semiconductor device package of claim 56, further comprising at least one additional multi-chip module, said at least one additional multi-chip module including at least one additional multi-chip module including:
a first semiconductor die with a plurality of bond pads arranged in an array on an active surface thereof; and
at least one second semiconductor die with a plurality of bond pads on an active surface thereof, each of said plurality of bond pads of said at least one second semiconductor die alignable with corresponding bond pads of said first semiconductor die, said active surfaces of said first semiconductor die and said at least one second semiconductor die facing one another, and said plurality of bond pads of said at least one second semiconductor die electrically connected to said corresponding bond pads of said first semiconductor die, other bond pads of said first semiconductor die being exposed laterally beyond an outer periphery of said at least one second semiconductor die, said other bond pads being alignable with corresponding contacts of said carrier.

58. The semiconductor device package of claim 56, wherein said carrier comprises a carrier substrate with said contacts comprising contact pads formed on a surface of said carrier substrate.

59. The semiconductor device package of claim 58, wherein said carrier substrate includes a recess formed in said surface and configured to receive said at least one second semiconductor die.

60. The semiconductor device package of claim 58, further comprising a thermally conductive material disposed between a backside of said at least one second semiconductor die and said carrier substrate.

61. The semiconductor device package of claim 56, wherein said carrier comprises leads.

62. The semiconductor device package of claim 56, wherein said first semiconductor die comprises a microprocessor.

63. The semiconductor device package of claim 62, wherein said at least one second semiconductor die comprises a memory device.

64. The semiconductor device package of claim 56, wherein said at least one second semiconductor die comprises a memory device.

65. The semiconductor device package of claim 64, wherein said first semiconductor die comprises a microprocessor.

66. The semiconductor device package of claim 56, wherein said plurality of bond pads of said at least one second semiconductor die are arranged in an array on said active surface thereof.

67. The semiconductor device package of claim 56, wherein said first semiconductor die includes outer bond pads that are exposed laterally beyond an outer periphery of said at least one second semiconductor die.

68. The semiconductor device package of claim 67, wherein said outer bond pads are configured to electrically connect at least one of said first semiconductor die and said at least one second semiconductor die to said carrier.

69. The semiconductor device package of claim 56, wherein said plurality of bond pads of said at least one second semiconductor die and said corresponding bond pads of said first semiconductor die are electrically connected to one another by way of conductive structures disposed therebetween.

70. The semiconductor device package of claim 69, wherein said conductive structures comprise balls, bumps, pillars, or columns.

71. The semiconductor device package of claim 69, wherein said conductive structures are formed of a material comprising a metal, an alloy, a conductive epoxy, a conductor-filled epoxy, or a z-axis conductive elastomer.

72. The semiconductor device package of claim 56, wherein said contacts of said carrier and said other bond pads of said first semiconductor die are electrically connected by conductive structures.

73. The semiconductor device package of claim 72, wherein said conductive structures comprise balls, bumps, pillars, or columns.

74. The semiconductor device package of claim 72, wherein said conductive structures are formed from a material comprising a metal, an alloy, a conductive epoxy, a conductor-filled epoxy, or a z-axis conductive elastomer.

75. The semiconductor device package of claim 72, wherein said conductive structures each comprise a plurality of members.

76. The semiconductor device package of claim 56, further comprising an encapsulant material at least laterally sealing at least said active surfaces of said first semiconductor die and said at least one second semiconductor die.

77. The semiconductor device package of claim 76, wherein said encapsulant material substantially covers at least said first semiconductor die.

78. The semiconductor device package of claim 76, wherein said encapsulant material comprises an underfill material.

79. The semiconductor device package of claim 56, wherein said encapsulant comprises a glob-top encapsulant.

80. The semiconductor device package of claim 61, further comprising a molded package encapsulating said first semiconductor die and said at least one second semiconductor die.

81. The semiconductor device package of claim 56, wherein said at least one alignment element comprises at least one alignment structure secured to and prodruding from said active surface of said first semiconductor die and configured to guide at least two adjoined edges of said at least one second semiconductor die.

82. The semiconductor device package of claim 81, wherein said alignment structure comprises a plurality of superimposed, contiguous, mutually adhered material layers.

83. The semiconductor device package of claim 82, wherein each of said plurality of layers comprises a photopolymer.

84. The semiconductor device package of claim 56, wherein said at least one alignment element comprises a plurality of recessed formed in said active surface, in which at least some of said plurality of bond pads of said first semiconductor die are located and recessed relative to said active surface of said first semiconductor die.

85. The semiconductor device package of claim 84, wherein said at least one second semiconductor die comprises conductive structures predisposed on each of said plurality of bond pads thereof.

86. The semiconductor device package of claim 56, wherein at least some of said plurality of bond pads of said at least one second semiconductor die are recessed relative to said active surface thereof.

87. The semiconductor device package of claim 56, comprising a plurality of second semiconductor dice.

88. A semiconductor device package, comprising:
at least a first multi-chip module, including:
a first semiconductor die with a plurality of bond pads arranged in an array on an active surface thereof and at least one alignment element on said active surface, said at least one alignment element comprising a plurality of superimposed, contiguous, mutually adhered layers comprising photopolymer and configured to position at least one second semiconductor die relative to a prespecified area of said active surface; and
said at least one second semiconductor die with a plurality of bond pads on an active surface thereof, each of said plurality of bond pads of said at least one second semiconductor die alignable with corresponding bond pads of said first semiconductor die, said active surfaces of said first semiconductor die and said at least one second semiconductor die facing one another, and said plurality of bond pads of said at least one second semiconductor die electrically connected to said corresponding bond pads of said first semiconductor die, other bond pads of said first semiconductor die being exposed laterally beyond an outer periphery of said at least one second semiconductor die; and
a carrier including contacts electrically connected to said other bond pads.

89. The semiconductor device package of claim 88, further comprising at least one additional multi-chip module, said at least one additional multi-chip module including at least one additional multi-chip module including:
a first semiconductor die with a plurality of bond pads arranged in an array on an active surface thereof; and
at least one second semiconductor die with a plurality of bond pads on an active surface thereof, each of said plurality of bond pads of said at least one second semiconductor die alignable with corresponding bond pads of said first semiconductor die, said active surfaces of said first semiconductor die and said at least one second semiconductor die facing one another, and said plurality of bond pads of said at least one second semiconductor die electrically connected to said corresponding bond pads of said first semiconductor die, other bond pads of said first semiconductor die being exposed laterally beyond an outer periphery of said at least one second semiconductor die, said other bond pads being alignable with corresponding contacts of said carrier.

90. The semiconductor device package of claim 88, wherein said carrier comprises a carrier substrate with said contacts comprising contact pads formed on a surface of said carrier substrate.

91. The semiconductor device package of claim 90, wherein said carrier substrate includes a recess formed in said surface and configured to receive said at least one second semiconductor die.

92. The semiconductor device package of claim 90, further comprising a thermally conductive material disposed between a backside of said at least one second semiconductor die and said carrier substrate.

93. The semiconductor device package of claim 88, wherein said carrier comprises leads.

94. The semiconductor device package of claim 88, wherein said first semiconductor die comprises a microprocessor.

95. The semiconductor device package of claim 94, wherein said at least one second semiconductor die comprises a memory device.

96. The semiconductor device package of claim 88, wherein said at least one second semiconductor die comprises a memory device.

97. The semiconductor device package of claim 96, wherein said first semiconductor die comprises a microprocessor.

98. The semiconductor device package of claim 88, wherein said plurality of bond pads of said at least one second semiconductor die are arranged in an array on said active surface thereof.

99. The semiconductor device package of claim 88, wherein said first semiconductor die includes outer bond pads that are exposed laterally beyond an outer periphery of said at least one second semiconductor die.

100. The semiconductor device package of claim 99, wherein said outer bond pads are configured to electrically connect at least one of said first semiconductor die and said at least one second semiconductor die to said carrier.

101. The semiconductor device package of claim 88, wherein said plurality of bond pads of said at least one second semiconductor die and said corresponding bond pads of said first semiconductor die are electrically connected to one another by way of conductive structures disposed therebetween.

102. The semiconductor device package of claim 101, wherein said conductive structures comprise balls, bumps, pillars, or columns.

103. The semiconductor device package of claim 101, wherein said conductive structures are formed of a material comprising a metal, an alloy, a conductive epoxy, a conductor-filled epoxy, or a z-axis conductive elastomer.

104. The semiconductor device package of claim 88, wherein said contacts of said carrier and said other bond pads of said first semiconductor die are electrically connected by conductive structures.

105. The semiconductor device package of claim 104, wherein said conductive structures comprise balls, bumps, pillars, or columns.

106. The semiconductor device package of claim 104, wherein said conductive structures are formed from a material comprising a metal, an alloy, a conductive epoxy, a conductor-filled epoxy, or a z-axis conductive elastomer.

107. The semiconductor device package of claim 104, wherein said conductive structures each comprise a plurality of members.

108. The semiconductor device package of claim 88, further comprising an encapsulant material at least laterally sealing at least said active surfaces of said first semiconductor die and said at least one second semiconductor die.

109. The semiconductor device package of claim 108, wherein said encapsulant material substantially covers at least said first semiconductor die.

110. The semiconductor device package of claim 108, wherein said encapsulant material comprises an underfill material.

111. The semiconductor device package of claim 88, further comprising an encapsulant substantially covering peripheral edges and a back side of said first semiconductor die.

112. The semiconductor device package of claim 93, further comprising a molded package encapsulating said first semiconductor die and said at least one second semiconductor die.

113. The semiconductor device package of claim 88, wherein said at least one alignment element is configured to guide at least two adjoined edges of said at least one second semiconductor die.

114. The semiconductor device package of claim 88, wherein said at least one alignment element comprises a plurality of recesses formed in said active surface, in which at least some of said plurality of bond pads of said first semiconductor die are located and recessed relative to said active surface of said first semiconductor die.

115. The semiconductor device package of claim 114, wherein said at least one second semiconductor die comprises conductive structures predisposed on each of said plurality of bond pads thereof.

116. The semiconductor device package of claim 88, wherein at least some of said plurality of bond pads of said at least one second semiconductor die are recessed relative to said active surface thereof.

117. The semiconductor device package of claim 88, comprising a plurality of second semiconductor dice.

* * * * *